United States Patent
Gibson et al.

(10) Patent No.: US 10,177,310 B2
(45) Date of Patent: Jan. 8, 2019

(54) AMORPHOUS METAL ALLOY ELECTRODES IN NON-VOLATILE DEVICE APPLICATIONS

(71) Applicant: Hewlett Packard Enterprise Development LP, Houston, TX (US)

(72) Inventors: Gary Gibson, Palo Alto, CA (US); James Elmer Abbott, Jr., Albany, OR (US); Zhiyong Li, Foster City, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/324,691

(22) PCT Filed: Jul. 30, 2014

(86) PCT No.: PCT/US2014/048806
§ 371 (c)(1),
(2) Date: Jan. 7, 2017

(87) PCT Pub. No.: WO2016/018284
PCT Pub. Date: Feb. 4, 2016

(65) Prior Publication Data
US 2017/0213959 A1  Jul. 27, 2017

(51) Int. Cl.
*H01L 45/00*  (2006.01)
*H01L 27/24*  (2006.01)
(Continued)

(52) U.S. Cl.
CPC ........... *H01L 45/128* (2013.01); *C22C 5/04* (2013.01); *C22C 27/02* (2013.01); *C22C 27/04* (2013.01);
(Continued)

(58) Field of Classification Search
None
See application file for complete search history.

(56) References Cited

U.S. PATENT DOCUMENTS 4,169,744 A * 10/1979 D'Silva .............. B23K 35/304
                                                          148/427
4,231,816 A  11/1980 Cuomo et al.
(Continued)

FOREIGN PATENT DOCUMENTS

CN      101533876      9/2009
EP      0677868        10/1995
(Continued)

OTHER PUBLICATIONS

Lugscheider et al., "Development of Nickel-Chromium-Silicon Base Filler Metals" Ninth International AWS-WRC Brazing Conference held in New Orleans, Louisiana, during Apr. 4-6, 1978, Welding Research Supplement, pp. 319-s to 324-s, Oct. 1978.*
(Continued)

*Primary Examiner* — Sitaramarao S Yechuri
(74) *Attorney, Agent, or Firm* — Hewlett Packard Enterprise Patent Department

(57) ABSTRACT

A non-volatile memory device includes two electrodes and an active region disposed between and in electrical contact with the electrodes. The active region contains a switching material capable of carrying a species of dopants and transporting the dopants under an electrical field. The electrode is an amorphous conductive material comprising 5 to 90 at % of a first metal, 5 to 90 at % of a second metal, and 5 to 90 at % of a metalloid, wherein the metalloid is any of carbon, silicon, and boron. The metalloid, the first metal, and the second metal account for at least 70 at % of the amorphous conductive material.

20 Claims, 3 Drawing Sheets

(51) Int. Cl.
*C22C 5/04* (2006.01)
*C22C 27/02* (2006.01)
*C22C 27/04* (2006.01)
*C22C 30/00* (2006.01)

(52) U.S. Cl.
CPC .......... *C22C 30/00* (2013.01); *H01L 27/2427* (2013.01); *H01L 27/2436* (2013.01); *H01L 27/2463* (2013.01); *H01L 45/08* (2013.01); *H01L 45/085* (2013.01); *H01L 45/1206* (2013.01); *H01L 45/1226* (2013.01); *H01L 45/1233* (2013.01); *H01L 45/1253* (2013.01); *H01L 45/142* (2013.01); *H01L 45/143* (2013.01); *H01L 45/146* (2013.01); *H01L 45/148* (2013.01); *H01L 45/16* (2013.01)

(56) References Cited

U.S. PATENT DOCUMENTS

| | | | |
|---|---|---|---|
| 4,288,302 A | 9/1981 | de Nora et al. | |
| 4,335,389 A | 6/1982 | Shirato et al. | |
| 4,522,844 A | 6/1985 | Khanna et al. | |
| 4,965,139 A | 10/1990 | Kabacoff et al. | |
| 5,479,197 A | 12/1995 | Fujikawa et al. | |
| 5,790,154 A | 8/1998 | Mitani et al. | |
| 5,966,153 A | 10/1999 | Mitani et al. | |
| 6,142,612 A | 11/2000 | Whitman | |
| 6,146,914 A | 11/2000 | Burke et al. | |
| 6,175,377 B1 | 1/2001 | Noshita et al. | |
| 6,198,143 B1 | 3/2001 | Ohsaki | |
| 6,299,294 B1 | 10/2001 | Regan | |
| 6,645,560 B2 | 11/2003 | Zhao et al. | |
| 6,679,788 B1 | 1/2004 | Heinrich et al. | |
| 6,715,859 B2 | 4/2004 | Pan | |
| 6,769,762 B2 | 8/2004 | Saito et al. | |
| 6,962,859 B2 | 11/2005 | Todd et al. | |
| 8,325,507 B2 | 12/2012 | Yang et al. | |
| 2002/0033750 A1 | 3/2002 | Oizumi et al. | |
| 2008/0237886 A1* | 10/2008 | Wu | B82Y 10/00 257/776 |
| 2008/0259131 A1 | 10/2008 | Cornell et al. | |
| 2010/0116990 A1* | 5/2010 | Xu | G01B 11/0683 250/339.06 |
| 2010/0233849 A1 | 9/2010 | Lee et al. | |
| 2011/0017977 A1 | 1/2011 | Bratkovski et al. | |
| 2011/0073828 A1 | 3/2011 | Zia et al. | |
| 2011/0182107 A1 | 7/2011 | Wu et al. | |
| 2011/0310183 A1 | 12/2011 | Tamaru et al. | |
| 2012/0156395 A1 | 6/2012 | Bilello | |
| 2013/0051121 A1 | 2/2013 | Yang et al. | |
| 2013/0062587 A1 | 3/2013 | Lee et al. | |
| 2013/0162724 A1 | 6/2013 | Pugliese, Jr. et al. | |
| 2014/0097081 A1* | 4/2014 | Morrissey | H01L 28/24 204/192.21 |
| 2016/0035973 A1* | 2/2016 | Raieszadeh | H01L 45/06 257/4 |

FOREIGN PATENT DOCUMENTS

| | | |
|---|---|---|
| JP | S556497 | 1/1980 |
| JP | 01222089 | 9/1989 |
| JP | H05009670 | 1/1993 |
| JP | H08209327 | 8/1996 |
| JP | H10157124 | 6/1998 |
| JP | H10202889 | 8/1998 |
| JP | H11186035 | 7/1999 |
| JP | 2000318196 | 11/2000 |
| JP | 2003513170 | 4/2003 |
| JP | 2008149687 | 7/2008 |
| JP | 2013157444 | 8/2013 |
| JP | 2013162018 | 8/2013 |

OTHER PUBLICATIONS

International Searching Authority, The International Search Report and the Written Opinion, dated Apr. 20, 2015, 13 Pages.
Spyropoulos-Antonakakis, N. et al., Charge Transport Mechanisms and Memory Effects in Amorphous Tanx Thin Films, Oct. 17, 2013, Nanoscale Research Letters 2013, 9 Pgs.
Baker et al., High-Temperature Oxidation Behavior of a New Ni—Ci—Mo—Si Alloy, Jan. 2, 2013, http://www.specialmetals.com/documents/High%20Temperature%20Oxidation%20behavior%20of%20a%20new%20NiCrMoSi%20Alloy.pdf.
Nishiyama et al., A Prominent Ni—Cr—Si—Cu Alloy Resisting in Metal Dusting, Mar. 13-17, 2011, http://journals.cambridge.org/action/displayAbstract;jsessionid=07E4EBEC289DC376708FCE7D1EFDBA1E.journals?fromPage=online&aid=8177368.
Saris et al., Stability of Thin Film Amorphous Metal Alloys, 1998, vol. 54, http://journals.cambridge.org/action/displayAbstract;jsessionid=07E4EBFC289DC376708FCE7D1EF.

* cited by examiner

AMORPHOUS METAL ALLOY ELECTRODES IN NON-VOLATILE DEVICE APPLICATIONS

BACKGROUND

Non-volatile memory is computer memory that can get back stored information even when not powered. Types of non-volatile memory may include resistive RAM (random access memory) (RRAM or ReRAM), phase change RAM (PCRAM), conductive bridge RAM (CBRAM), ferroelectric RAM (F-RAM), etc.

Resistance memory elements, such as resistive RAM, or ReRAM, can be programmed to different resistance states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications. Examples of resistive memory devices include valence change memory and electrochemical metallization memory, both of which involve ionic motion during electrical switching and belong to the category of memristors.

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period.

BRIEF DESCRIPTION OF THE DRAWINGS

Some examples of the teachings are described with respect to the following figures.

DETAILED DESCRIPTION

Figure 1:
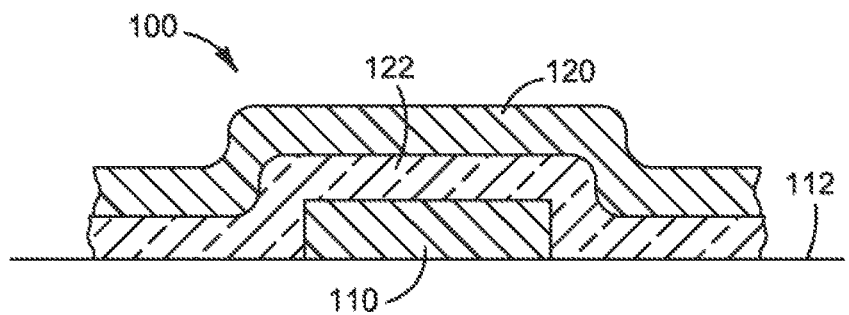
FIG. 1 is a cross-sectional view of a two-terminal nanoscale switching device formed on a substrate, in accordance with an example.

In the following description, numerous specific details are set forth to provide a thorough understanding of the examples. However, it will be appreciated that the examples may be practiced without limitation to these specific details. In other instances, well-known methods and structures may not be described in detail to avoid unnecessarily obscuring the description of the examples. Also, the examples may be used in combination with each other.

While a limited number of examples have been disclosed, it should be understood that there are numerous modifications and variations therefrom. Similar or equal elements in the Figures may be indicated using the same numeral.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Non-volatile memory elements, or cells, can be used in a variety of applications, such as read-only memory, reprogrammable memory, and other uses where long term persistent storage is required.

Resistive memory elements, or cells, can be used in a variety of applications, including non-volatile solid state memory, programmable logic, signal processing, control systems, pattern recognition, and other applications.

As used in the specification and appended claims, the term "resistance memory elements" or "resistance memory cells" refers broadly to programmable non-volatile resistors where the switching mechanism involves atomic motion and rearrangement, including memristors, valance change memory, electrochemical metallization memory, and others.

Memristors, or memristive devices, are nano-scale devices that may be used as a component in a wide range of electronic circuits, such as memories, switches, and logic circuits and systems. In a memory structure, a crossbar of memristors may be used. For example, when used as a basis for memories, the memristor may be used to store a bit of information, 1 or 0, corresponding to whether the memristor is in its high or low resistance state (or vice versa). When used as a logic circuit, the memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

When used as a switch, the memristor may either be in a low resistance (closed) or high resistance (open) state in a crosspoint memory. During the last few years, researchers have made great progress in finding ways to make the switching function of these memristors behave efficiently. For example, tantalum oxide (TaO)-based memristors have been demonstrated to have superior endurance over other nano-scale devices capable of electronic switching. In lab settings, tantalum oxide-based memristors are capable of over 10 billion switching cycles.

A memristor may comprise a switching material, such as $TiO_x$ or $TaO_x$, sandwiched between two electrodes. Memristive behavior is achieved by the movement of ionic species (e.g., oxygen ions or vacancies) within the switching material to create localized changes in conductivity via modulation of a conductive filament between two electrodes, which results in a low resistance "ON" state, a high resistance "OFF" state, or intermediate states. Initially, when the memristor is first fabricated, the entire switching material may be nonconductive. As such, a forming process may be required to form the conductive channel in the switching material between the two electrodes. A known forming process, often called "electroforming", includes applying a sufficiently high (threshold) voltage across the electrodes for a sufficient length of time to cause a nucleation and formation of a localized conductive channel (or active region) in the switching material. The threshold voltage and the length of time required for the forming process may depend upon the type of material used for the switching material, the first electrode, and the second electrode, and the device geometry.

Metal or semiconductor oxides may be employed in memristive devices; examples include either transition metal oxides, such as tantalum oxide, titanium oxide, yttrium oxide, hafnium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include transition metal nitrides, such as aluminum nitride, gallium nitride, tantalum nitride, and silicon nitride.

Non-volatile memory is computer memory that can get back stored information even when not powered. Types of non-volatile memory may include resistive RAM (random access memory) (RRAM or ReRAM), phase change RAM (PCRAM), conductive bridge RAM (CBRAM), ferroelectric RAM (F-RAM), etc.

Resistance memory elements, such as resistive RAM, or ReRAM, can be programmed to different resistance states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications. Examples of resistive memory devices include valence change memory and electrochemical metallization memory, both of which involve ionic motion during electrical switching and belong to the category of memristors.

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period.

As used herein, the term "nanoscale" means the element (e.g., electrode or active material) has one or more dimensions smaller than one micrometer, and, in some examples, less than 500 nanometers. In many cases, however, the term "nanoscale" refers to dimensions between 1 and 100 nm.

FIG. 1 shows a two-terminal nanoscale switching device 100 according to one example of the principles described herein. The switching device comprises a bottom electrode 110 formed on a substrate 112, a top electrode 120 extending over and intersecting the bottom electrode 110, and an active region 122 disposed between the top and bottom electrodes. As will be described in greater detail below, the active region 122 contains a switching material, the electrical characteristics of which can be controllably modified to allow the device to be switched to ON and OFF states. Each of the top and bottom electrodes 110 and 120 may have a width and a thickness measured in nanoscale dimensions. For example, the electrodes may have a width in the range of 15 nm to 500 nm, and a thickness in the range of 5 nm and 500 nm. Likewise, the active region 122 may have a height that is on the nanoscale and typically tens of nanometers. Due to the nanoscale dimensions of the top and bottom electrodes and the active region, the device has a very small volume and relatively limited thermal dissipation capability. As a result, the device is susceptible to heat buildup and thermal damages. As will be described below, the present disclosure effectively solves this problem and significantly improves the thermal stability and cycling endurance of the device.

Figure 2:
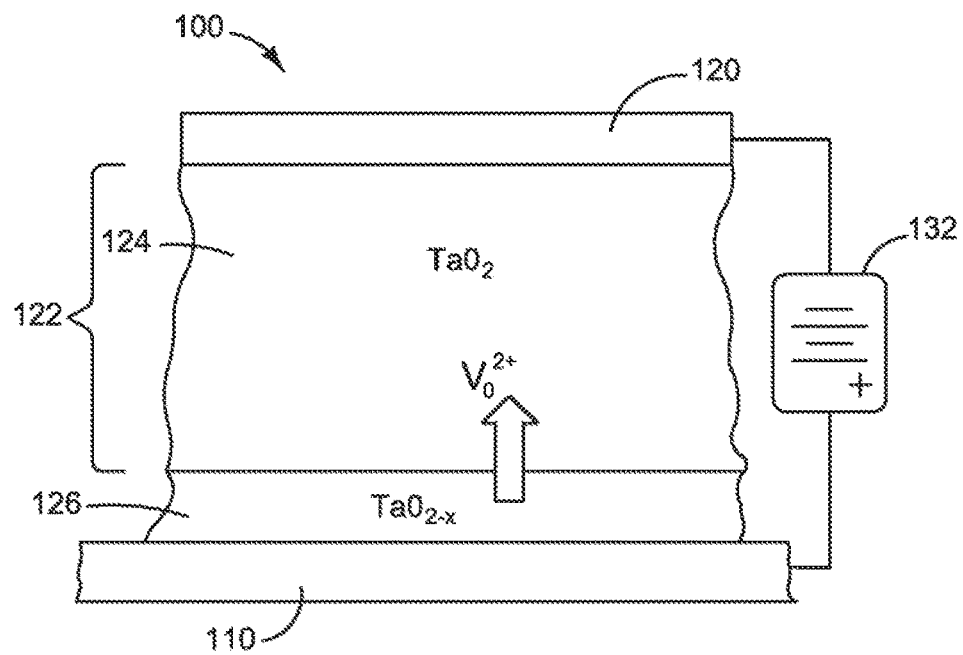
FIG. 2 is a schematic depiction of the two-terminal nanoscale switching device of FIG. 1 showing its components.

To facilitate a better understanding of the significance of the issue addressed by the teachings, the components and operation principles of the switching device 100 are described first, with reference to FIG. 2. As shown in FIG. 2, in one example, the active region 122 between the top electrode 120 and bottom electrode 110 may have two sub-regions: a primary active region 124 and a dopant source region 126. The primary active region 124 contains a switching material. The switching material is capable of carrying a species of mobile ionic dopants such that the dopants can be controllably transported into and/or through the switching material to change the electrical properties of either the switching material or the interface of the switching material and an electrode, which in the illustrated example is the top electrode 120. This ability to change the electrical properties as a function of dopant distribution allows the switching device 100 to be placed in different switching states by applying a switching voltage to the electrodes.

Generally, the switching material may be electronically semiconducting or nominally insulating and a weak ionic conductor. Many different materials with their respective suitable dopants can be used as the switching material. Materials that exhibit suitable properties for switching include oxides, sulfides, selenides, nitrides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. Further examples of suitable switching materials include metal hydrides, such as lithium aluminum hydride, nickel hydride, sodium aluminum hydride, and magnesium metal hydride. These listings of possible switching materials are not exhaustive and do not restrict the scope of the present teachings.

The dopant species used to alter the electrical properties of the switching material depends on the particular type of switching material chosen, and may be cations, anions or vacancies, or impurities such as electron donors or acceptors. For instance, in the case of transition metal oxides such as $TaO_2$, the dopant species may be oxygen vacancies. For GaN, the dopant species may be nitride vacancies or sulfide ions. For compound semiconductors, the dopants may be n-type or p-type impurities.

The dopant source region 126 may contain a dopant source material that functions as a source/sink of dopants that can be driven into or out of the switching material in the primary active region 124 to alter the overall resistance of the switching device 100. The dopant source material may be generally the same as the switching material but with a higher dopant concentration. For example, if the switching material is $TaO_2$, the dopant source material may be $TaO_{2-x}$, where x is a number significantly smaller than 1, such as from 0.01 to 0.1. In this case, the $TaO_{2-x}$ material acts as a source/sink of oxygen vacancies ($V_O^{2+}$) that can drift into and through the $TaO_2$ switching material in the primary active region 124.

The nanoscale switching device 100 can be switched between ON and OFF states by controlling the concentration and distribution of dopants in the primary active region 124. When a DC switching voltage from a voltage source 132 is applied across the top and bottom electrodes 120 and 110, an electrical field is created across the active region 122. This electric field, if of sufficient strength and proper polarity, may drive the dopants from the dopant source region 126 into the primary active region 124, and cause the dopants to drift through the switching material in the primary active region 124 towards the top electrode 120, thereby placing the device in an ON state.

If the polarity of the electrical field is reversed, the dopants may drift in an opposite direction across the primary active region 124 and away from the top electrode 120, thereby placing the device in an OFF state. In this manner, the switching is reversible and may be repeated. Due to the relatively large electrical field needed to cause dopant drifting, after the switching voltage is removed, the locations of the dopants remain stable in the switching material. In other words, the switching may be non-volatile.

The state of the switching device may be read by applying a read voltage to the top and bottom electrodes 120 and 110 to sense the resistance across these two electrodes. The read voltage is typically much lower than the threshold voltage required to cause drifting of the ionic dopants between the top and bottom electrodes, so that the read operation does not alter the ON/OFF state of the switching device.

The switching behavior described above may be based on different mechanisms. In one mechanism, the reduction of resistance may be a "bulk" property of the switching material in the primary active region 124. An increase of the dopant level in the switching material causes the resistance across the switching material to fall, and this may account for the decrease of the overall resistance of the device between the top and bottom electrodes.

In another mechanism, the switching behavior may be an "interface" phenomenon. Initially, with a low dopant level in the switching material, the interface of the switching material and the top electrode 120 may behave like a Schottky barrier, with a high electrical barrier that is difficult for electrons to tunnel through. As a result, the device has a relatively high resistance. When dopants are injected into the switching material by applying a switching voltage, the dopants drift towards the top electrodes 120. The increased concentration of dopants at the electrode interface changes its electrical property from one like a Schottky barrier to one like an Ohmic contact, with a significantly reduced electrical barrier height or width. As a result, electrons can tunnel through the interface much more easily, and this may account for the significantly reduced overall resistance of the switching device. It is also possible that the resistance change is the result of a combination of both the bulk and interface mechanisms. Even though there may be different mechanisms for explaining the switching behavior, it should be noted that the present teachings do not rely on or depend on any particular mechanism for validation, and the scope of the present teachings is not restricted by which switching mechanism is actually at work.

Figure 3:
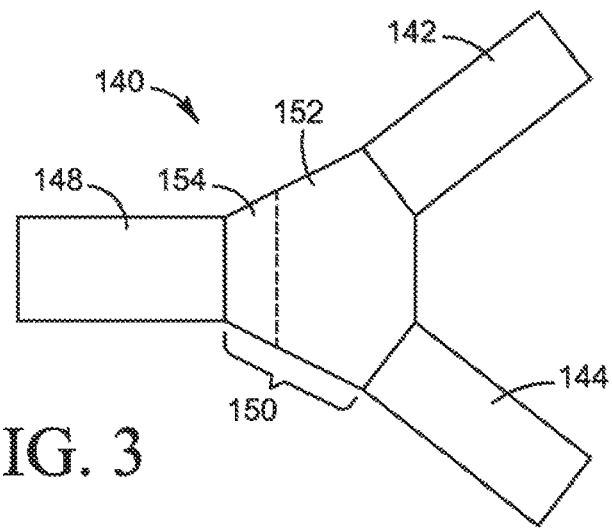
FIG. 3 is a schematic view of a nanoscale three-terminal switching device, in accordance with an example.

In the foregoing description with reference to FIGS. 1 and 2, a non-volatile memory device with two electrodes or terminals has been described. A non-volatile memory device may, however, have more than two terminals. For instance, FIG. 3 shows an example of a memory device 140 with three terminals. The memory device 140 may have an active region 150 that is divided into a primary active region 152 containing a switching material, and a dopant source region 154 that contains a dopant source material. The switching device 140 also has three electrodes. The first electrode 142 and second electrode 144 are disposed to be in electrical contact with the primary active region 152, while the third electrode 148 is disposed in electrical contact with the dopant source region 154. The third electrode 148 may be used for switching of the device, while the first and second electrodes 142, 144 may be used for sensing the state of the device. Initially, the switching material in the primary active region 152 may have a low dopant concentration, and as a result the resistance of the device as measured between the first and second electrodes 142, 144 is high. This may be the OFF state of the device. When a switching voltage of sufficient magnitude and proper polarity is applied to the third electrode 148 with respect to the first and second electrodes, the electrical field causes the ionic dopants to drift from the dopant source material into and across the switching material in the primary active region 152 towards the first and second electrodes 142, 144. The injection and redistribution of the ionic dopants in the primary active region 152 may significantly reduce the resistance of the device measured between the first and second electrodes. When the resistance is reduced to a predefined value, the device is said to have been switched to the ON state.

As mentioned above, due to its small volume and limited heat dissipation capability, the nanoscale switching device may be subject to subject to substantial heating and temperature rise during operation. For instance, in a typical switching operation, the voltage needed to switch the device ON may be as high as 2 Volts (internal voltage) or up to 10 Volts or more (external voltage) if the series resistance from the metal nanowire electrodes is high, and the current may be on the order of µAmps; in some examples, the current is on the order of 100 µAmps, and in other examples, the current could be as low as 5 µAmps. This amount of power can heat the nanoscale switching device to a fairly high temperature and cause severe thermal stress to the device. Nanoscale switching devices prior to the present teachings had thermal stability issues and could break down after going through multiple switching cycles.

In connection with the present disclosure, it has been discovered that as devices approach nanoscale dimensions, electrical resistance of the electrodes becomes a significant consideration. One reason that the polycrystalline nanowire resistance is high is due to the large surface and grain boundary scattering for electron in a polycrystalline nanowire electrode.

In accordance with examples of the present teachings, this electrode resistance issue is effectively addressed by employing conductive materials that are in an amorphous state. An amorphous metal alloy is a metallic material with a disordered atomic-scale structure. In contrast to most metals, which are crystalline and therefore have a highly ordered arrangement of atoms, amorphous metal alloys are non-crystalline. Materials in which such a disordered structure is produced directly from the liquid state during cooling are called "glasses", and so amorphous metals are commonly referred to as "metallic glasses" or "glassy metals". However, there are several other ways in which amorphous metals can be produced, including physical vapor deposition (sputter), solid-state reaction, ion irradiation, melt spinning, mechanical alloying, and atomic layer deposition (ALD).

As used herein, the term "amorphous" used with respect to the electrodes, means that the conductive material used in the electrodes has no long range order of the positions of the atoms making up the material.

Amorphous metal alloys produced by these techniques are, strictly speaking, not glasses. However, materials scientists commonly consider amorphous metal alloys to be a single class of materials, regardless of how they are prepared.

As the line width of metal conductors scales down, there is a significant increase in their resistivity due to both grain boundary and interface electron scattering. Since amorphous materials lack gain boundaries and usually have much smoother surfaces, amorphous metals instead of polycrystalline metals may be used for integrated circuit interconnects.

Although pure metal thin films are usually polycrystalline, a sputter-deposited alloy thin film may have a better amorphous-forming ability.

With the removal of grain boundaries and the reduction of surface roughness in the amorphous metallic nanowire, the electron scattering effect with the size shrinking would be greatly reduced. As a result, the electrical resistivity is expected to be improved in the small feature regime.

At least one of the top and bottom electrodes 120, 110 may be formed with glassy, or amorphous, metal alloys. In some examples, both the top and the bottom electrodes 120, 110 may be formed with glassy metal alloys. In the case of three-electrode devices, at least one of the electrodes 142, 144, 148 may be formed with glassy metal alloys. In some examples, two or all three electrodes 142, 144, 148 may be formed with glassy metal alloys.

Stable amorphous metal materials have been designed and created utilizing combinations of two or three metallic elements from Periods 4, 5, 6, 9, and 10 of the Periodic Table with the addition of a metalloid component, such as silicon. A trace amount of oxygen may also be incorporated into select thin films to further stabilize the material while maintaining the properties of an amorphous metal. Specific experiments have included Ta, W, Ni, Pt, Mo, Si, and O. Additional elements that are reasonably expected to create amorphous thin films of interest based on their known chemical properties are V, Nb, Ti, Zr, Hf, Cr, Co, Pd, Rh, and Ir. Boron and carbon may also be used as replacements for or in addition to Si for the applications discussed in this disclosure. The desired atomically smooth, grain free structure of an amorphous material has been demonstrated, along with the formation of these thin films under ambient deposition conditions with no additional processing required post deposition.

In accordance with the teachings herein, one or more of the electrodes 110, 120, 142, 144, 148 may be an amorphous metal alloy. For example, an amorphous electrode can be a combination of three components, including: about 5 to 90 atomic percent (at %) of a first metal (first component) that can be titanium, vanadium, chromium, cobalt, nickel, zirconium, niobium, molybdenum, rhodium, palladium, hafnium, tantalum, tungsten, iridium, or platinum; about 5 to 90 at % of a second metal (second component) that can be titanium, vanadium, chromium, cobalt, nickel, zirconium, niobium, molybdenum, rhodium, palladium, hafnium, tantalum, tungsten, iridium, or platinum; and about 5 to 90 at % of a metalloid (third component) that can be silicon, carbon, or boron. In this example, the second metal is different than the first metal. Generally, the three components account for at least 70 at % of the amorphous thin metal film, or alternatively, two components can account for at least 70 at % of the amorphous thin metal film. This range of first metal, second metal, and metalloid can likewise be independently modified at the lower end to 10 at %, or 20 at %, and/or at the upper end to 40 at %, 50 at %, 70 at %, or 80 at %. Furthermore, in one example, the first metal, the second metal, and the metalloid can account for at least 80 at %, at least 90 at %, or even 100 at % of the amorphous thin metal film.

Optionally, from 5 to 85 at % of a third metal can be present as well, and can include metals such as titanium, vanadium, chromium, cobalt, nickel, zirconium, niobium, molybdenum, rhodium, palladium, hafnium, tantalum, tungsten, iridium, or platinum. In this example, the third metal is different than the first metal and the second metal. This range of metalloid, first metal, and second metal can likewise be independently modified at the lower end to 10 at %, or 20 at %, and/or at the upper end to 80 at %, or 70 at %. Furthermore, in one example, the metalloid, the first metal, the second metal, and the third metal can account for at least 80 at %, at least 90 at %, or even 100 at % of the electrode(s) 110, 120, 142, 144, 148.

The present three or four component mixture of elements can be mixed in a manner and in quantities that the mixture is homogenous. Additionally, the mixture can be sintered and further applied to a suitable substrate using deposition techniques. Generally, the resulting electrode is amorphous. By using three components in high enough concentrations, a "confusion" of sizes and properties disfavors the formation of lattice structures that are more typical in single component or even two component systems. Selecting components with suitable size differentials can contribute to minimizing crystallization of the structure. For example, the amorphous electrode may have an atomic dispersity of at least 12% between two of the three components. In another aspect, the amorphous electrode may an atomic dispersity of at least 12% between all three of the components, e.g., first metal, second metal, and metalloid. As used herein, "atomic dispersity" refers to the difference in size between the radii of two atoms. In one example, the atomic dispersity can be at least 15%, and in one aspect, can be at least 20%. The atomic dispersity between components can contribute to the exceptional properties of the present electrodes, including thermal stability, oxidative stability, chemical stability, and surface roughness, which are not achieved by typical electrodes. Oxidative stability can be measured by the amorphous electrode's oxidation temperature and/or oxide growth rate as discussed herein.

Figure 4:
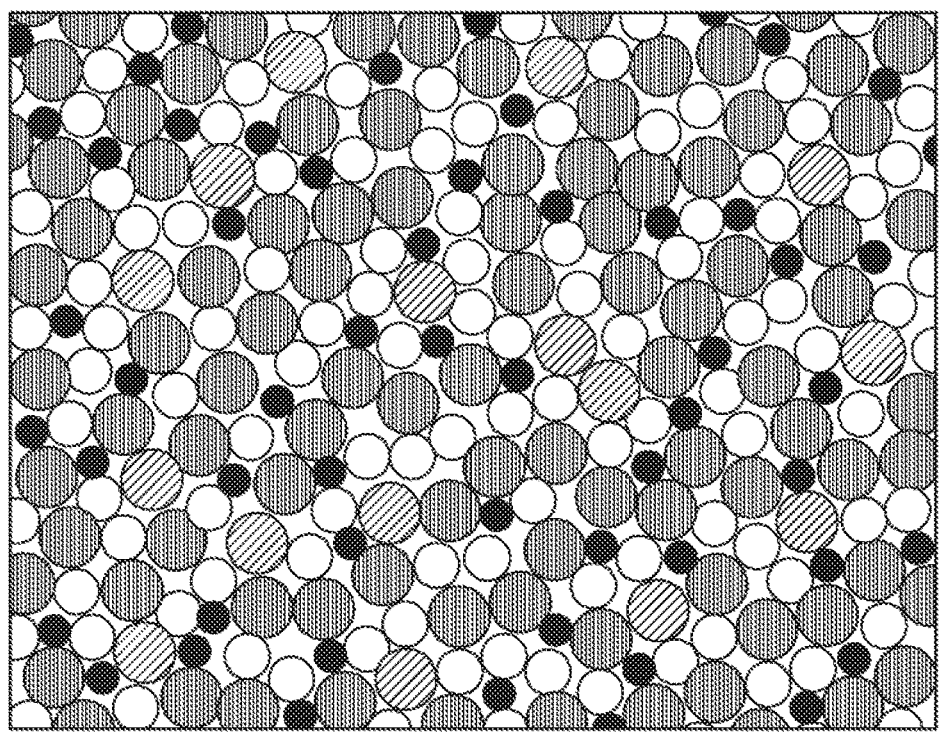
FIG. 4 is a figure of a schematic cross-sectional view of a distribution of elements of an amorphous thin metal film in accordance with one example of the present disclosure.
Figure 5:
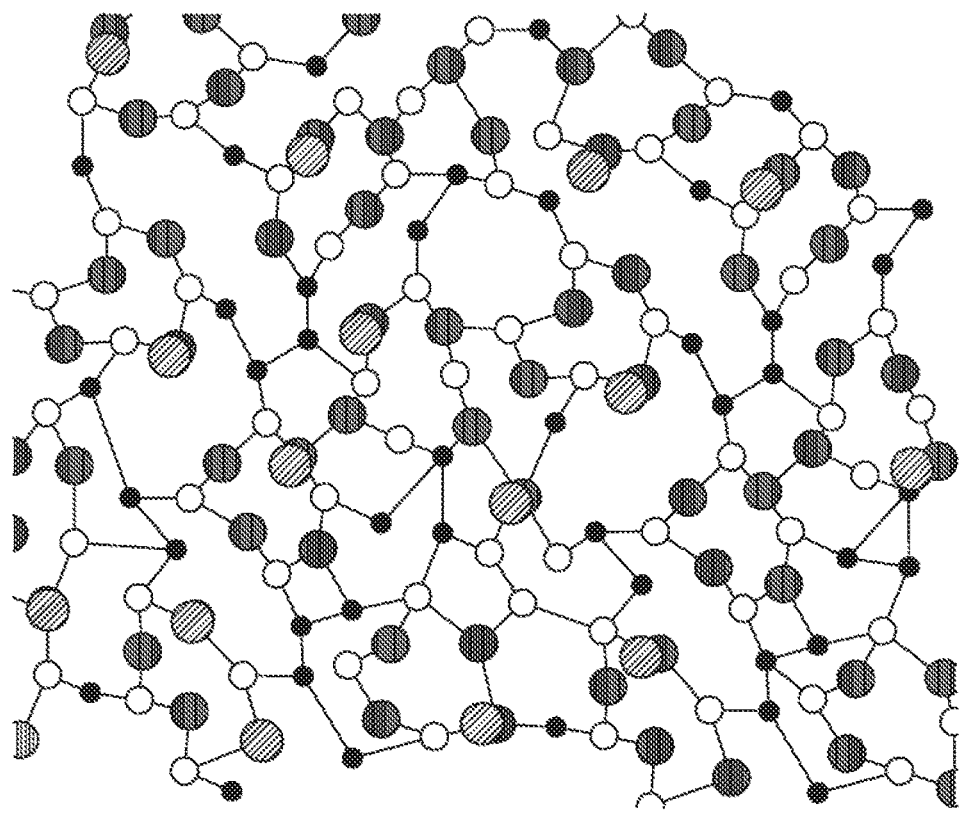
FIG. 5 is a figure of a lattice structure of an amorphous thin metal film in accordance with one example of the present disclosure.

Returning now to the figures, the present amorphous electrodes can have a distribution of components with an atomic dispersity as represented in FIG. 4, which shows four elements. Notably, the present electrodes can be generally amorphous with a smooth, grain-free structure. Turning to FIG. 5, the lattice structure of the present amorphous electrodes can be represented, which are non-crystalline. More crystalline structures tend to have more defined grain boundaries, which can be less desirable for electrical conductivity.

It is understood that FIGS. 4 and 5 are schematic in nature only and are presented for purposes of depicting the general amorphous nature of the various structures.

As discussed herein, the present amorphous electrodes can have exceptional properties including thermal stability, oxidative stability, and surface roughness. In one example, the present electrodes can have a root mean square (RMS) roughness of less than 1 nm. In one aspect, the RMS roughness can be less than 0.5 nm. In another aspect, the RMS roughness can be less than 0.1 nm. One method to measure the RMS roughness includes measuring atomic force microscopy (AFM) over a 100 nm by 100 nm area. In other aspects, the AFM can be measured over a 10 nm by 10 nm area, a 50 nm by 50 nm area, or a 1 micron by 1 micron area. Other light scattering techniques can also be used such as X-ray reflectivity or spectroscopic ellipsometry.

In another example, the amorphous electrodes can have a thermal stability of at least 400° C. In one aspect, the thermal stability can be at least 800° C. In another aspect, the thermal stability can be at least 900° C. As used herein, "thermal stability" refers to the maximum temperature that the amorphous electrode can be heated while maintaining its amorphous structure. One method to measure the thermal stability includes sealing the amorphous electrode in a quartz tube, heating the tube to a temperature, and using X-ray diffraction to evaluate the atomic structure and degree of atomic ordering.

In still another example, the amorphous electrodes can have an oxidation temperature of at least 700° C. In one aspect, the oxidation temperature can be at least 800° C., and in another aspect, at least 1000° C. As used herein, the oxidation temperature is the maximum temperature that the amorphous electrode can be exposed before failure of the thin film due to stress creation and embrittlement of the partially or completely oxidized thin film. One method to measure the oxidation temperature is to heat the amorphous electrode at progressively increasing temperatures in air until the electrode cracks and flakes off the substrate.

In yet another example, the amorphous electrodes can have an oxide growth rate of less than 0.05 nm/min. In one aspect, the oxide growth rate can be less than 0.04 nm/min, or in another aspect, less than 0.03 nm/min. One method to measure the oxide growth rate is to heat the amorphous electrode under air (20% oxygen) at a temperature of 300° C. measure the amount of oxidation on the amorphous electrode using spectroscopic ellipsometry periodically, and average the data to provide a nm/min rate. Depending on the components and the method of manufacture, the amorphous electrode can have a wide range of electric resistivity, including ranging from about 100 to 2,000 $\mu\Omega\cdot cm$.

Generally, the elements used to form the amorphous electrodes can have a positive heat of mixing. Additionally, the amorphous electrodes can further include a dopant. In one example, the dopant can include nitrogen, oxygen, and mixtures thereof. The dopant can generally be present in the amorphous electrode in an amount ranging from about 0.1 to 15 at %. In one example, the dopant can be present in an amount ranging from about 0.1 to 5 at %. Smaller amounts of dopants can also be present, but at such low concentrations, they would typically be considered impurities. Additionally, in one aspect, the amorphous electrode can be devoid of aluminum, silver, and gold. As used herein, "devoid of" refers to the absence of materials in quantities other than trace amounts, such as impurities.

Turning now to a method of manufacturing an amorphous electrode, the method can involve depositing the first metal, the second metal, and the metalloid onto a substrate to form the amorphous electrode. The electrode can include the list of first and second metals and metalloids described above, in the concentrations provided, optionally together with the third metal and optionally together with the dopant.

In another example, prior to depositing, the first metal, the second metal, and the metalloid can be mixed to form a blend that can be subsequently deposited.

Generally, the step of depositing can include sputtering, atomic layer deposition (ALD), chemical vapor deposition (CVD), electron beam deposition, or thermal evaporation. In an example, the depositing can be performed by sputtering. The sputtering can generally be performed at 5 to 15 mTorr at a deposition rate of 5 to 10 nm/min with the target approximately 4 inches from a stationary substrate. Other deposition conditions may be used and other deposition rates can be achieved depending on variables such as target size, electrical power used, pressure, sputter gas, target to substrate spacing and a variety of other deposition system dependent variables. In another aspect, depositing can be performed in the presence of a dopant that is incorporated into the thin film. In another specific aspect, the dopant can be oxygen and/or nitrogen.

Figure 6:
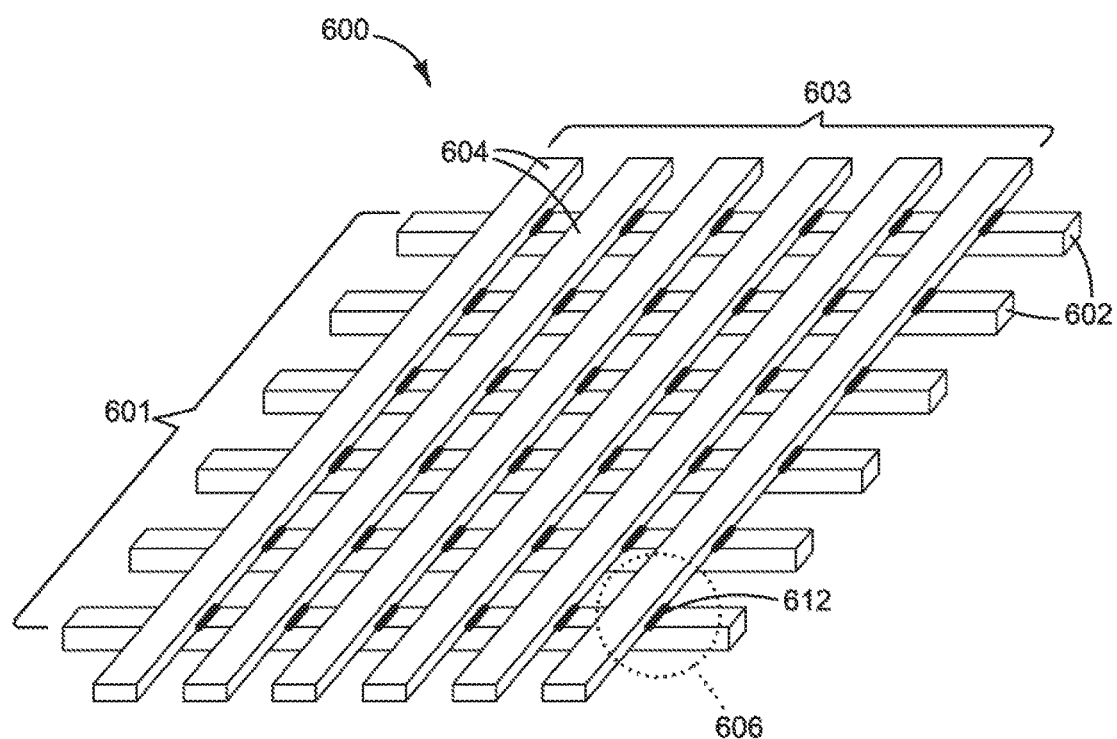
FIG. 6 is a schematic three-dimensional view of a crossbar array of two-terminal nanoscale switching devices, in accordance with an example.
Figure 7:
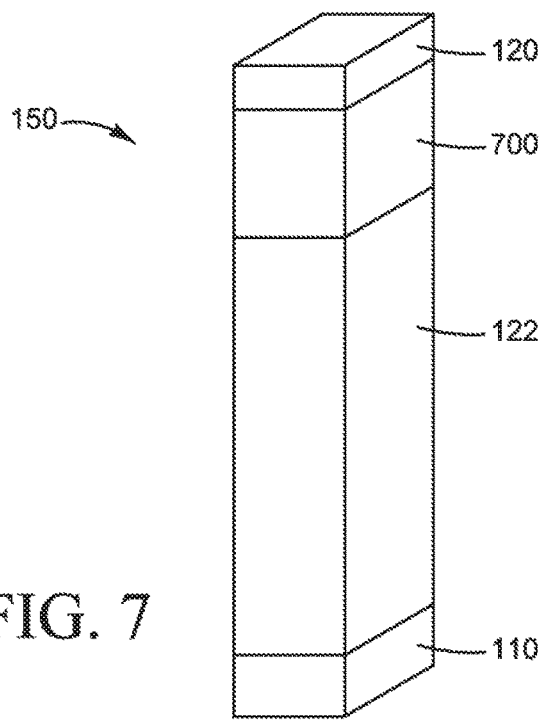
FIG. 7 is a diagram illustrating a selector element positioned adjacent a memristive element, which may be used in a crossbar array, in accordance with an example.

The nanoscale switching device may be formed into an array for various applications. FIG. 6 shows an example of a two-dimensional array 600 of such switching devices. The array has a first group 601 of generally parallel nanowires 602 running in a first direction, and a second group 603 of generally parallel nanowires 604 running in a second direction at an angle, such as 90 degrees, from the first direction. The two layers of nanowires 602 and 604 form a two-dimensional lattice 600 which is commonly referred to as a crossbar structure, with each nanowire 602 in the first layer intersecting a plurality of the nanowires 604 of the second layer. A two-terminal switching device 606, similar to the two-terminal switching device 100 described in FIGS. 1 and 2, may be formed at each intersection of the nanowires 602 and 604. The switching device 606 has a nanowire of the second group 603 as its top electrode and a nanowire of the first group 601 as the bottom electrode, and an active region 612 containing a switching material between the two nanowires. The active region 612 may correspond to the active region 122 of device 100 (FIGS. 1, 2) or of device 150 (FIG. 7, below). In accordance with an example of the teachings herein, either the nanowires 602 of the first group 601 or the nanowires 604 of the second group 603 or both may be formed of a glassy metal alloy to provide lower contact resistance of the switching devices in the crossbar array.

In considering crossbar arrays, particular programmable elements within a crossbar array are often read from or written to by applying half a read or write voltage to one wire connected to the target programmable element and the other half read or write voltage to the other wire connected to the target programmable element. This arrangement applies a full read or write voltage to the target programmable element while applying only half of the read or write voltage to the remaining, or half-selected, programmable elements. The half-selected programmable elements are those programmable elements positioned along the same upper and lower lines (or row and column lines) as a fully selected target programmable element. When half the read or write voltage is applied to the half-selected programmable elements, currents are produced that add to the current sensed, for example, by the reading circuitry used to sense the electric current from the target programmable element; a fraction of the currents used to write also pass through half-selected write elements. These additional currents can adversely impact the read, write and erase processes. For example, the currents can cause a misread of the state of a target programmable element and can cause inadvertent writing during the course of many reads, sometimes referred to as "read disturb."

Each half-selected programmable element contributes a small amount of unwanted current (sometimes referred to as a "sneak current") to sensing or writing circuitry used to sense or write with the current flowing through the target programmable element. To limit the amount of electric current contributed by the half-selected programmable elements, non-linear selecting devices or selectors may be used. Selectors of the type described herein facilitate programmable elements having high-degrees of nonlinearity. Programmable elements having high degrees of nonlinearity allow a memory array to have greater numbers of programmable elements along a particular line. For example, where sneak currents are otherwise on the order of the signal current, a nonlinearity limiting the sneak current to $\frac{1}{1000}^{th}$ of the current at one-half the read or write voltage permits upward of about 1,000 programmable elements along a particular upper or lower line.

FIG. 7 illustrates one example of a programmable element 612 suitable for use in a crossbar memory array 600. A memristive memory device 150 may include first electrode 110 and second electrode 120, sandwiching a selector 700 and a memory device, such as memristive device or memristor 122, described above.

The selector 700 generally exhibits a highly nonlinear current-voltage response over a range of voltages, typically both positive and negative. Depending on the application, the nonlinearity of the selector 700 serves to block or substantially reduce current at sub-threshold voltages. For example, the selector 700 may serve to block or substantially reduce current to the memristive device or memristor 208 at voltages less than the full read or write voltages referred to above. In one example, the selector exhibits a non-linearity such that the current flowing through the selector at the half-voltage (write or read) is much less than the current at the corresponding full voltage. Stated mathematically, the nonlinearity, K, of the programmable element is expressed as $K=I(V)/I(V/2)>>2$, where V is the voltage drop across the programmable element and K=2 is the value expected for an essentially linear device. The selector 700 may be an oxide, such as niobium oxide or vanadium oxide.

Notably, it has been recognized that amorphous electrodes as discussed herein can have exceptional properties including thermal stability, oxidative stability, chemical stability, and surface roughness. As such, the present thin metal films can be used in a number of applications including electronic semiconductor devices, optical coatings, and printing technologies, for example.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to 5 at %" should be interpreted to include not only the explicitly recited values of about 1 to 5 at %, but also include individual values and sub-ranges within the indicated range. Thus, included in this numerical range are individual values such as 2, 3.5, and 4 and sub-ranges such as from 1 to 3, from 2 to 4, and from 3 to 5, etc. This same principle applies to ranges reciting only one numerical value. Furthermore, such an interpretation should apply regardless of the breadth of the range or the characteristics being described.

EXAMPLES

The following examples illustrate aspects of the present disclosure that are presently known. Thus, these examples should not be considered as limiting, but are merely in place to teach how to make compositions of the present disclosure. As such, a representative number of compositions and their method of manufacture are disclosed herein.

Example 1—Thin Metal Films

Various thin metal films were prepared by DC and RF sputtering at 5 to 15 mTorr under argon, RF at 50 to 100 W, and DC at 35 to 55 W onto a silicon wafer. The resulting film thickness was in the range of 100 to 500 nm. The specific components and amounts are listed in Table I.

TABLE I

List of Thin Film Compositions and Ratios (atomic and weight percents).

| Thin Film Composition | Ratio (at %) | Ratio* (wt %) |
|---|---|---|
| TaNiSi | 40:40:20 | 71:23:6 |
| TaWSi | 40:40:20 | 48:49:4 |
| TaWSi | 30:50:20 | 36:61:4 |
| TaMoSi | 40:40:20 | 62:33:5 |
| TaPtSi | 40:40:20 | 46:50:4 |
| TaWNiSi | 35:35:10:20 | 46:46:4:4 |

*Weight ratio calculated from at % and rounded to the nearest integer.

Example 2—Thin Metal Films

Various thin metal films are prepared by DC and RF sputtering at 5 mTorr to 15 mTorr under argon. RF at 50 W to 100 W, and DC at 35 W to 55 W onto a silicon wafer. The resulting film thickness is in the range of 100 nm to 500 nm. The specific components and amounts are listed in Table II.

TABLE II

List of Thin Film Compositions and Ratios (atomic and weight percents).

| Thin Film Composition | Ratio (at %) | Ratio* (wt %) |
|---|---|---|
| TaCoB | 60:30:10 | 85:14:1 |
| NbWB | 50:40:10 | 38:61:1 |
| MoPtC | 40:50:10 | 28:71:1 |
| WTiC | 30:40:30 | 71:25:5 |
| MoNiSi | 45:40:5 | 63:35:2 |

*Weight ratio calculated from at % and rounded to the nearest integer.

Example 3—Thin Metal Film Properties

The amorphous thin metal films of Example 1 were tested for electrical resistivity, thermal stability, chemical stability, oxidation temperature, and oxide growth rate. The results are listed in Table III. All of the films had a surface RMS roughness of less than 1 nm.

Surface RMS roughness was measured by atomic force microscopy (AFM). Electrical resistivity was measured by collinear four point probe for different deposition conditions providing the range listed in Table III. Thermal Stability was measured by sealing the amorphous thin metal film in a quartz tube at approximately 50 mTorr and annealing up to the temperature reported with X-ray confirmation of the amorphous state, where the X-ray diffraction patterns showed evidence of Bragg reflections. Chemical stability was measured by immersing the amorphous thin metal film in Hewlett Packard commercial inks CH602SERIES, HP Bonding Agent for Web Press; CH585SERIES, HP Bonding Agent for Web Press; and CH598SERIES, HP Black Pigment Ink for Web Press; at 55° C. and checked at 2 and 4 weeks. Adequate chemical stability was present with the thin film showed no visual physical change or delamination, indicated by a "Yes" in Table III. Oxidation temperature was measured as the maximum temperature that the amorphous thin metal film can be exposed before failure of the thin film due to stress creation and embrittlement of the partially or completely oxidized thin film. Oxide growth rate was measured by heating the amorphous thin metal film under air (20% oxygen) at a temperature of 300° C., measuring the amount of oxidation on the amorphous thin metal film using spectroscopic ellipsometry periodically over a periods of 15, 30, 45, 60, 90, and 120 minutes, and then at 12 hours, and averaging the data to provide a nm/min rate.

TABLE III

Thin Film Properties.

| Thin Film Composition | Ratio (at %) | Electric Resistivity (µΩ · cm) | Thermal Stability (° C.) | Chemical Stability | Oxidation Temperature (° C.) | Oxide Growth Rate (nm/min) |
|---|---|---|---|---|---|---|
| TaNiSi | 40:40:20 | 230-440 | 500 | Yes | 700 | 0.035 |
| TaWSi | 40:40:20 | 210-255 | 900 | Yes | 1000 | 0.027* |
| TaWSi | 30:50:20 | 210-1500 | 900 | Yes | Not tested | 0.049* |
| TaMoSi | 40:40:20 | 165-1000 | 900 | Yes | Not tested | 0.132* |
| TaPtSi | 40:40:20 | 300 | 400 | Yes | Not tested | 0 |
| TaWNiSi | 35:35:10:20 | 200-440 | 800 | Yes | 800 | 0.039* |

*Showed evidence of passivation (decreased growth rate) after approximately 60 minutes.

Example 4—RMS Surface Roughness

The RMS Surface Roughness (in nm) was measured under different conditions of preparation for TaWSi (30:50:20 at %). The films were prepared at 100 W RF, under 15 mTorr, and 30 min. sputter time. Tube anneal of the alloy was performed under the conditions listed (as deposited and at three different annealing temperatures, 800° C., 900° C., and 1000° C.).

TABLE IV

RMS Surface Roughness for TaWSi (30:50:20).

| TaWSi (30:50:20) AFM Sample | RMS Roughness (nm) |
|---|---|
| As deposited | 0.875 |
| 800° C. tube anneal | 0.868 |
| 900° C. tube anneal | 0.684 |
| 1000° C. tube anneal | 0.824 |

The amorphous alloys disclosed herein have been shown to have the following unique materials properties:

They resist crystallization up to 1000° C. in vacuum anneal.

They are resistant to bulk oxidation up to high temperatures with the thin film remaining stable to more than 900° C. when typical refractory metals such at Ta typically oxidize and fail as low as 600° C.

They are resistant to chemical attack in aqueous environments for at least four weeks at 70° C. with no observed change in materials properties.

The thermal conductivity of these amorphous materials has been measured to be as low as 2.4 $Wm^{-1}K^{-1}$ for amorphous TaWSi. This compares to a thermal conductivity for Al of about 240 $Wm^{-1}K^{-1}$.

The roughness of these materials as deposited is less than 0.5 nm RMS; TaWSi maintained an RMS roughness of less than 1 nm even when heated to 1000° C.

The use of these amorphous metals as electrodes for memristors and selectors improves their uniformity, robustness, and reliability. It can also increase their thermal isolation relative to conventional electrode materials.

In the foregoing description, numerous details are set forth to provide an understanding of the present teachings. However, it will be understood by those skilled in the art that the present teachings may be practiced without these details. While the disclosure has been made with respect to a limited number of examples, those skilled in the art will appreciate numerous modifications and variations therefrom. It is intended that the appended claims cover such modifications and variations as fall within the true spirit and scope of the teachings.

What is claimed is:

1. A non-volatile memory device including:
   two or three electrodes; and
   an active region disposed between and in electrical contact with the electrodes, the active region comprising a primary active region and a dopant source region, the primary active region containing a switching material capable of carrying a species of dopants and transporting the dopants under an electrical field, wherein at least one the electrodes comprises an amorphous metal alloy comprising
  5 to 90 at % of a first metal, wherein the first metal is selected from the group consisting of titanium, vanadium, chromium, cobalt, nickel, zirconium, niobium, molybdenum, rhodium, palladium, hafnium, tantalum, tungsten, iridium, and platinum,
  5 to 90 at % of a second metal, wherein the second metal is selected from the group consisting of titanium, vanadium, chromium, cobalt, nickel, zirconium, niobium, molybdenum, rhodium, palladium, hafnium, tantalum, tungsten, iridium, and platinum, wherein the second metal is different than the first metal; and
  5 to 90 at % of a metalloid, wherein the metalloid is selected from the group consisting of carbon, silicon, and boron,
wherein the metalloid, the first metal, and the second metal account for at least 70 at % of the amorphous metal alloy.

2. The memory device of claim 1, wherein the non-volatile memory device is a memristor.

3. The memory device of claim 1, wherein each of the electrodes comprises the amorphous metal alloy.

4. The memory device of claim 1, wherein the amorphous metal alloy further comprises from 5 to 85 at % of a third metal, wherein the third metal is selected from the group consisting of titanium, vanadium, chromium, cobalt, nickel, zirconium, niobium, molybdenum, rhodium, palladium, hafnium, tantalum, tungsten, iridium, and platinum, and wherein the third metal is different than the first metal and the second metal.

5. The memory device of claim 1, wherein the amorphous metal alloy further comprises from 0.1 to 15 at % of a dopant, the dopant being selected from the group consisting of nitrogen, oxygen, and mixtures thereof.

6. The memory device of claim 1, wherein the amorphous metal alloy has a surface RMS roughness of less than 1 nm.

7. The memory device of claim 1, wherein the amorphous metal alloy has a thermal stability of at least 400° C. and has an oxidation temperature of at least 700° C.

8. The memory device of claim 1, wherein the amorphous metal alloy has an atomic dispersity of at least 12% between at least two of the metalloid, the first metal, and the second metal relative to one another.

9. The memory device of claim 1, further comprising a selector disposed between at least one of the electrodes and the active region.

10. A nanoscale crossbar array comprising:
  a first group of conductive nanowires running in a first direction;
  a second group of conductive nanowires running in a second direction and intersecting the first group of conductive nanowires; and
  a plurality of switching devices formed at intersections of the first and second groups of conductive nanowires, each switching device having a first electrode formed by a first nanowire of the first group and a second electrode formed by a second nanowire of the second group, and an active region disposed at the intersection between the first and second nanowires and comprising a primary active region and a dopant source region, the primary active region containing a switching material capable of carrying a species of dopants and transporting the dopants under an electrical field,
  wherein the first electrode or the second electrode comprises an amorphous conductive material having a composition given by:
    5 to 90 at % of a first metal, wherein the first metal is selected from the group consisting of titanium, vanadium, chromium, cobalt, nickel, zirconium, niobium, molybdenum, rhodium, palladium, hafnium, tantalum, tungsten, iridium, and platinum,
    5 to 90 at % of a second metal, wherein the second metal is selected from the group consisting of titanium, vanadium, chromium, cobalt, nickel, zirconium, niobium, molybdenum, rhodium, palladium, hafnium, tantalum, tungsten, iridium, and platinum, wherein the second metal is different than the first metal, and
    5 to 90 at % of a metalloid, wherein the metalloid is selected from the group consisting of carbon, silicon, and boron, and
  wherein the metalloid, the first metal, and the second metal account for at least 70 at % of the amorphous conductive material.

11. The nanoscale crossbar array of claim 10, wherein each switching device includes a selector.

12. The nanoscale crossbar array of claim 10, wherein the switching devices are memristors.

13. The nanoscale crossbar array of claim 10, wherein the amorphous conductive material has a surface RMS roughness of less than 1 nm.

14. The nanoscale crossbar array of claim 10, wherein the amorphous conductive material has a thermal stability of at least 400° C. and has an oxidation temperature of at least 700° C.

15. The nanoscale crossbar array of claim 10, wherein the amorphous conductive material has an atomic dispersity of at least 12% between the metalloid, the first metal, and the second metal relative to one another.

16. A method of manufacturing a non-volatile memory device with two or three electrodes and an active region disposed between and in electrical contact with the electrodes, the active region containing a primary active region and a dopant source region, the primary active region containing a switching material capable of carrying a species of dopants and transporting the dopants under an electrical field, wherein the method comprises:
  forming at least one of the electrodes from an amorphous conductive material having a composition given by:
    5 to 90 at % of a first metal, wherein the first metal is titanium, vanadium, chromium, cobalt, nickel, zirconium, niobium, molybdenum, rhodium, palladium, hafnium, tantalum, tungsten, iridium, or platinum;
    5 to 90 at % of a second metal, wherein the second metal is titanium, vanadium, chromium, cobalt, nickel, zirconium, niobium, molybdenum, rhodium, palladium, hafnium, tantalum, tungsten, iridium, or platinum, and wherein the second metal is different than the first metal; and
    5 to 90 at % of a metalloid, wherein the metalloid is carbon, silicon, or boron;
  wherein the metalloid, the first metal, and the second metal account for at least 70 at % of the amorphous conductive material.

17. The method of claim 16, wherein the forming the at least one of the electrodes includes:
  mixing the metalloid, the first metal, and the second metal to form a blend, and sputtering the blend to form the amorphous conductive material.

18. The method of claim 17, wherein the sputtering is performed in the presence of a dopant selected from the group consisting of nitrogen, oxygen, and mixtures thereof,
wherein the amorphous conductive material comprises from 0.1 to 15 at % of the dopant.

19. The method of claim 16, wherein the amorphous conductive material further comprises from 5 to 85 at % of a third metal,
wherein the third metal is titanium, vanadium, chromium, cobalt, nickel, zirconium, niobium, molybdenum, rhodium, palladium, hafnium, tantalum, tungsten, iridium, or platinum, and
wherein the third metal is different than the first metal and the second metal.

20. The method of claim 16, wherein the at least one of the electrodes has a surface RMS roughness of less than 1 nm, a thermal stability of at least 400° C., an oxidation temperature of at least 700° C., and an oxide growth rate of less than 0.05 nm/min.

\* \* \* \* \*